US012772506B2

(12) United States Patent
Weber et al.

(10) Patent No.: US 12,772,506 B2
(45) Date of Patent: Oct. 20, 2026

(54) VERTICAL JUNCTION FIELD EFFECT TRANSISTOR INCLUDING A PLURALITY OF MESA REGIONS

(71) Applicant: Infineon Technologies Austria AG, Villach (AT)

(72) Inventors: Hans Weber, Villach (AT); Björn Fischer, Munich (DE)

(73) Assignee: Infineon Technologies Austria AG, Villach (AT)

( * ) Notice: Subject to any disclaimer, the term of this patent is extended or adjusted under 35 U.S.C. 154(b) by 493 days.

(21) Appl. No.: 18/450,078

(22) Filed: Aug. 15, 2023

(65) Prior Publication Data

US 2024/0079503 A1 Mar. 7, 2024

(30) Foreign Application Priority Data

Sep. 6, 2022 (EP) .................................... 22194208

(51) Int. Cl.
*H10D 30/66* (2025.01)
*H10D 30/01* (2025.01)
(Continued)

(52) U.S. Cl.
CPC ....... *H10D 30/831* (2025.01); *H10D 30/0297* (2025.01); *H10D 30/0515* (2025.01);
(Continued)

(58) Field of Classification Search
CPC ............. H10D 30/831; H10D 30/0297; H10D 30/0515; H10D 30/665; H10D 62/8325; H10D 62/124
See application file for complete search history.

(56) References Cited

U.S. PATENT DOCUMENTS 6,870,201 B1 * 3/2005 Deboy ................. H10D 62/106
257/E29.198
7,479,672 B2 1/2009 Zhao
(Continued)

FOREIGN PATENT DOCUMENTS

EP 1699083 B1 9/2011
JP 2005340250 A 12/2005

OTHER PUBLICATIONS

Zhao, J.H., et al., “3.6 mΩ cm2, 1726 V 4H-SiC normally-off trenched-and-implanted vertical JFETs”, ISPSD, Cambridge UK, Apr. 14-17, 2003, pp. 50-53.

*Primary Examiner* — Chad M Dicke
*Assistant Examiner* — Valerie N Newton
(74) *Attorney, Agent, or Firm* — Murphy, Bilak & Homiller, PLLC

(57) ABSTRACT

A vertical junction field effect transistor includes mesa regions and trench structures extending along a first lateral direction in a semiconductor body and arranged alternately along a second lateral direction. The trench structures include a gate contact material electrically connected to a gate region of a first conductivity type in the semiconductor body. A width of the trench structures satisfies one or more of the following conditions: i) the width of at least one trench structure arranged outermost along the second lateral direction is smaller than in a more central part of the trench structures; or ii) the width of at least some trench structures is smaller along an end part in the first lateral direction than in the more central part, an extent of the end part along the first lateral direction being larger than a pitch between neighboring trench structures along the second lateral direction.

20 Claims, 4 Drawing Sheets

(51) Int. Cl.
*H10D 30/83* (2025.01)
*H10D 62/17* (2025.01)
*H10D 62/832* (2025.01)
*H10D 64/27* (2025.01)

(52) U.S. Cl.
CPC ......... *H10D 30/665* (2025.01); *H10D 62/343* (2025.01); *H10D 62/8325* (2025.01); *H10D 64/513* (2025.01)

(56) References Cited

U.S. PATENT DOCUMENTS

| | | | | |
|---|---|---|---|---|
| 9,484,404 | B2 * | 11/2016 | Barletta | H10D 30/668 |
| 2006/0043480 | A1 * | 3/2006 | Tsuchitani | H10D 62/111<br>257/341 |
| 2012/0205668 | A1 | 8/2012 | Watanabe | |

* cited by examiner

VERTICAL JUNCTION FIELD EFFECT TRANSISTOR INCLUDING A PLURALITY OF MESA REGIONS

TECHNICAL FIELD

The present disclosure is related to a semiconductor device, in particular to a vertical junction field effect transistor (VJFET) including a plurality of mesa regions.

BACKGROUND

Technology development of new generations of semiconductor devices, e.g. junction field effect transistors (JFETs), aims at improving electric device characteristics and reducing costs by shrinking device geometries. Although costs may be reduced by shrinking device geometries, a variety of tradeoffs and challenges have to be met when increasing device functionalities per unit area. For example, a trade-off between area-specific on-state resistance, $R_{on}$xA, and reliability requirements influenced by, for example, electric breakdown capability, requires design optimization.

Thus, there is a need for an improved junction field effect transistor.

SUMMARY

An example of the present disclosure relates to a vertical junction field effect transistor (VJFET). The VJFET includes a plurality of mesa regions extending along a first lateral direction in a semiconductor body. The VJFET further includes a plurality of trench structures extending along the first lateral direction. The plurality of mesa regions and the plurality of trench structures are arranged alternately along a second lateral direction. The plurality of trench structures include a gate contact material electrically connected to a gate region of a first conductivity type in the semiconductor body via at least one of a bottom side or a sidewall of the plurality of trench structures. A width of the plurality of trench structures satisfies one or more of the following conditions: i) the width of at least one of the plurality of trench structures arranged outermost along the second lateral direction is smaller than in a more central part of the plurality of trench structures; ii) the width of at least some of the plurality of trench structures is smaller along an end part in the first lateral direction than in the more central part of the plurality of trench structures. An extent of the end part along the first lateral direction is larger than a pitch between neighboring trench structures of the plurality of trench structures along the second lateral direction.

Another example of the present disclosure relates to a method for manufacturing a vertical junction field effect transistor (VJFET). The method includes forming a plurality of mesa regions extending along a first lateral direction in a semiconductor body. The method further includes forming a plurality of trench structures extending along the first lateral direction. The plurality of mesa regions and the plurality of trench structures are arranged alternately along a second lateral direction. The plurality of trench structures include a gate contact material electrically connected to a gate region of a first conductivity type in the semiconductor body via at least one of a bottom side or a sidewall of the plurality of trench structures. A width of the plurality of trench structures satisfies one or more of the following conditions: i) the width of at least one of the plurality of trench structures arranged outermost along the second lateral direction is smaller than in a more central part of the plurality of trench structures; ii) the width of at least some of the plurality of trench structures is smaller along an end part in the first lateral direction than in the more central part of the plurality of trench structures. An extent of the end part along the first lateral direction is larger than a pitch between neighboring trench structures of the plurality of trench structures along the second lateral direction.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of VJFETs and together with the description serve to explain principles of the examples. Further examples are described in the following detailed description and the claims.

DETAILED DESCRIPTION

Figure 1A:
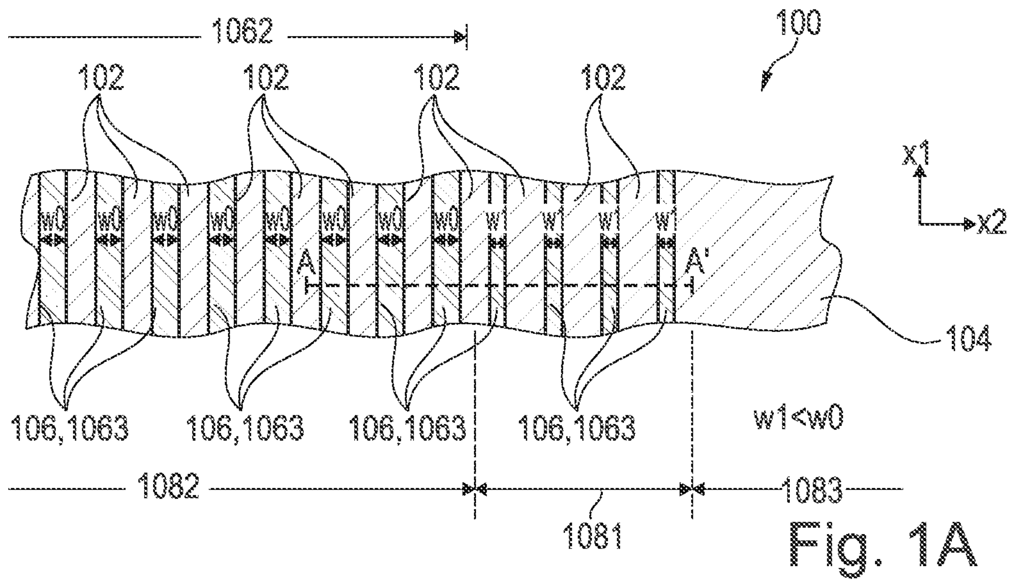
FIGS. 1A to 1C are schematic plan views for illustrating examples of VJFETs.

In the following detailed description, reference is made to the accompanying drawings, which form a part hereof and in which are shown by way of illustrations specific examples of VJFETs. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as a y b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of a vertical junction field effect transistor (VJFET) may include a plurality of mesa regions extending along a first lateral direction in a semiconductor body. A plurality of trench structures may extend along the first lateral direction. The plurality of mesa regions and the plurality of trench structures may be arranged alternately along a second lateral direction. The plurality of trench structures may include a gate contact material electrically connected to a gate region of a first conductivity type in the semiconductor body via at least one of a bottom side or a sidewall of the plurality of trench structures. A width of the plurality of trench structures may satisfy one or more of the following conditions: i) the width of at least one of the plurality of trench structures arranged outermost along the second lateral direction is smaller than in a more central part of the plurality of trench structures; or ii) the width of at least some of the plurality of trench structures is smaller along an end part in the first lateral direction than in the more central part of the plurality of trench structures. An extent of the end part along the first lateral direction may be larger than a pitch between neighboring trench structures of the plurality of trench structures along the second lateral direction.

The first lateral direction may be a longitudinal direction of the trench structures. The second lateral direction may be a transverse direction that is perpendicular to the first lateral direction. For example, a width of the trench structures may be measured along the second lateral direction, for example.

The VJFET may be part of an integrated circuit or may define a discrete semiconductor device or a semiconductor module, for example. For example, the VJFET may be a trenched and implanted vertical-channel JFET, TI-VJFET. In a vertical-channel JFET, a load current flow is between a first load electrode over a first surface of the semiconductor body and a second load electrode over a second surface opposite to the first surface along the vertical direction. In the vertical-channel JFET, a load current may flow along the vertical direction perpendicular to the first and/or second surface.

The first surface may be a front surface or a top surface of the semiconductor body, and the second surface may be a back surface or a rear surface of the semiconductor body, for example. For example, the semiconductor body may be attached to a lead frame via the second surface, for example. Over the first surface of the semiconductor body, bond pads may be arranged and bond wires may be bonded on the bond pads, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may a crystalline SiC semiconductor substrate having none, one or more SiC layers formed thereon. For example, the silicon carbide crystal may have a hexagonal polytype, e.g., 4H or 6H. The silicon carbide semiconductor body may be homogeneously doped or may include differently doped SiC layer portions. The silicon carbide semiconductor body may include one or more layers from another material with a melting point close to or higher than crystalline silicon carbide. For example, the layers from another material may be embedded in the crystalline silicon carbide substrate. The silicon carbide semiconductor substrate may have two essentially parallel main surfaces of the same shape and size and a lateral surface area connecting the edges of the two main surfaces.

The VJFET may be configured to conduct currents of more than 1 A or more than 10 A or even more than 100 A. For example, the VJFET may be designed as a transistor cell array of a plurality of transistor cells having a same layout. The transistor cell array may be a 1-dimensional or a 2-dimensional regular arrangement of the plurality of transistor cells. For example, the plurality of transistor cells of the transistor cell array may be electrically connected in parallel. For example, source regions of the plurality of transistor cells of the VJFET transistor cell array may be electrically connected together. Likewise, drain regions of the plurality of transistor cells of the VJFET transistor cell array may be electrically connected together. For example, gate regions of the plurality of transistor cells of the VJFET transistor cell array may be electrically connected together. A transistor cell of the transistor cell array or a part thereof, e.g. the gate region, may be designed in the shape of a stripe, a polygon, a circle, or an oval, for example.

A number of transistor cells of the transistor cell array may depend on the maximum load current, for example. For example, a number of transistor cells of the transistor cell array may be larger than 100, or larger than 1000, or even larger than 10000, for example. The VJFET may be further configured to block voltages between the load electrodes, e.g. between drain and source of the VJFET, of more than 60V, 100V, 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the VJFET, for example. The blocking voltage of the VJFET may be adjusted by an impurity concentration and/or a vertical extension of a drift region in the semiconductor body. A doping concentration of the drift region may gradually or in steps increase or decrease with increasing distance to the first surface at least in portions of its vertical extension. According to other examples the impurity concentration in the drift region may be approximately uniform. For VJFETs based on silicon, a mean impurity concentration in the drift region may be between $2\times10^{12}$ $cm^{-3}$ and $1\times10^{17}$ $cm^{-3}$, for example in a range from $5\times10^{12}$ $cm^{-3}$ to $1\times10^{15}$ $cm^{-3}$ or to $2\times10^{15}$ $cm^{-3}$. In some cases, the mean impurity concentration in the drift region for JFETs based on silicon may be in a range from $1\times10^{15}$ $cm^{-3}$ to $1\times10^{17}$ $cm^{-3}$. In the case of a JFET based on SiC, a mean impurity concentration in the drift region may be between $5\times10^{14}$ $cm^{-3}$ and $1\times10^{17}$ $cm^{-3}$, for example in a range from $1\times10^{15}$ $cm^{-3}$ to $2\times10^{16}$ $cm^{-3}$. A vertical extension of the drift region may depend on voltage blocking requirements, e.g. a specified voltage class, of the VJFET. When operating the VJFET in voltage blocking mode, a space charge region may vertically extend partly or totally through the drift region depending on the blocking voltage applied to the VJFET.

The source electrode and the drain electrode may be part of a wiring area over the semiconductor body. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric structure may be arranged. Contact plug(s) or contact line(s) may be formed in openings in the interlayer dielectric structure to electrically connect parts, e.g. metal lines or contact areas, of different wiring levels to one another. The source electrode may be formed by one or more elements of the wiring area over the first surface. Likewise, the drain electrode may be formed by one or more elements of the wiring area over the second surface.

For example, each of the plurality mesa regions may be laterally confined by two adjacent trench structures of the plurality of trench structures. In the plurality of mesa regions, a mesa channel region of a second conductivity type may be formed. The gate contact material of the plurality of trench structures may be formed of one or more conductive materials, e.g. metal, metal silicide, metal compound, highly doped semiconductor material such as highly doped polycrystalline silicon. For example, the gate contact material may be a single layer, e.g. a highly doped polycrystalline layer, or a stack of layers. For example, the trench structures may further include a dielectric structure. The dielectric structure may include a plurality of merged dielectric parts that may differ in material, for example. The dielectric structure may be or may include an insulating material such as an oxide, e.g., $SiO_2$, a nitride, e.g., $Si_3N_4$, a high-k dielectric, or a low-k dielectric, or any combination thereof. For example, the dielectric structure may be formed as a disposed oxide (TEOS). The gate contact material may be electrically connected to the gate region of the first conductivity type via the bottom side and/or the sidewall of the trench structures. For example, the gate contact material may be electrically connected to the gate region through an opening in the dielectric structure, e.g. at a bottom side of the trench structures.

A doping concentration in the mesa channel region may be set by in-situ doping with dopants of the second conductivity type when forming a semiconductor layer on a substrate, e.g. by a layer deposition technique. The doping concentration in the mesa channel region may, in addition or as an alternative, be set by ion implantation of dopants of the second conductivity type through a sidewall of trenches of the trench structures, e.g. by one or more tilted ion implantation processes. The one or more tilted ion implantation processes may introduce more dopants into a central third part of the mesa region than in each of the two adjacent outer third parts.

For example, dopants in a semiconductor body comprising SiC may include Al, B, Be, Ga, or any combination thereof for p-type doping, an N, P, or any combination thereof for n-type doping. For example, dopants in a semiconductor body comprising Si may include Al, B, Ga, In, or any combination thereof for p-type doping, an P, As, Sb, hydrogen-related donors, or any combination thereof for n-type doping.

The width of the trench structures may be defined by a lateral extent of the trench structure at the first surface. For example, the width of the trench structures may correspond to a lateral distance between top sides of two adjacent mesa regions. The width of the trench structures may vary. For example, the width may vary along a longitudinal direction with respect to a single one of the trench structures. This may apply to none, some, or all of the plurality of trench structures. In addition or as an alternative, the width of the trench structures may also vary with respect to adjacent trench structures. For example, the width of the trench structures may be constant in an active transistor area of the VJFET. The active transistor area may be defined by an area where a load current enters the semiconductor body through the first surface, e.g. front surface. For example, the active transistor or active VJFET area may be defined by an area where source contacts plugs are placed. The width of the trench structures may vary in a transition region between the active transistor area and an edge termination area. For example, the trench structures may end before the edge termination area. In other words, the trench structures may be absent in the edge termination area, for example. The edge termination area laterally separates the active VJFET area and a field-free area and may completely surround the active VJFET area laterally. In a blocking mode or in a reverse biased mode of the VJFET, the blocking voltage between the active VJFET area and the field-free area laterally drops across the termination structure. The edge termination area may have a higher or a slightly lower voltage blocking capability than the active VJFET area. The edge termination area may include an edge termination structure, e.g. a junction termination extension (JTE) with or without a variation of lateral doping (VLD), one or more laterally separated guard rings, or any combination thereof.

One example of varying the width between laterally spaced trench structures is that at least one of the plurality of trench structures arranged outermost along the second lateral direction is smaller than in a more central part, e.g. in the active transistor or VJFET area, of the plurality of trench structures. Another example of varying the width with respect to a single one of the trench structure is that respective trench structures is smaller along an end part in the first lateral direction, e.g. in the transition region between the active transistor area and the edge termination area, than in the more central part, e.g. in the transistor cell area, of the plurality of trench structures.

Varying the width of the trench structures in the VJFET described above and below allows for reducing a curvature of electric equipotential lines, e.g. in the transition region between the active transistor area and the edge termination area. This may be beneficial for avoiding an undesired electric breakdown in the transition region. For example, voltage stabilization caused by dopants of the first conductivity type around a bottom side of the trench structures may be weakened by channel ion implantations of dopants of the second conductivity type. When reducing the trench dimensions, less dopants may be introduced into mesa regions by tilted ion implants, and, thus, voltage stabilization may be improved.

For example, the width of the trench structures may decrease across n trench structures of the plurality of trench structures that are arranged outermost along the second lateral direction, wherein n is an integer ranging from 2 to 100. For example, the width may continuously decrease over a first number of trench structures along the second lateral direction from the transistor cell area to the edge termination area, and may then be constant along a second number of trench structures toward the edge termination area. The width may also continuously decrease over a number of trench structures up to the outermost trench structure along the second lateral direction, i.e. the outermost trench structure being the trench structure that is located closest to the edge termination area. The width may also be decreased in steps, e.g. a first number of adjacent trench structures having a constant first width may be followed toward the edge termination area by a second number of adjacent trench structures having a constant second width that is smaller than the first width. The above exemplary width variations may be combined and repeated in any way, for example.

For example, the width of the at least one of the plurality of trench structures may be constant, and the number of the at least one of the plurality of trench structures may be an integer ranging from 2 to 100. For example, the n trench structures located closest to the edge termination area along the second lateral direction may have a width that is smaller than in a more central part, e.g. in the active transistor area. A transition between the different widths may be continuously or in steps or a combination thereof over a number of trench structures as described above, for example.

For example, a pitch between neighboring trench structures of the plurality of trench structure may be constant along the second lateral direction. The pitch may be defined by a center-to-center distance of two adjacent trench structures. When the pitch is constant along the second lateral direction, and the width of the trench structures decreases toward the edge termination area, the width of the mesa region correspondingly increases toward the edge termination area. This design may be beneficial with respect to simplicity, for example.

For example, the width of the at least one or the at least some of the plurality of trench structures may be in a range from 10% to 95% of the width in the more central part of the plurality of trench structures. For example, the width of the at least one or the at least some of the plurality of trench structures in the transition area between the transistor cell area and the edge termination area may be in a range from 10% to 95%, or from 20% to 90%, or from 30% to 80% of the plurality of trench structures in the transistor cell area.

For example, the width of at least 90% of the plurality of trench structures may be smaller along the end part in the first lateral direction than in the more central part of the at least 90% of the plurality of trench structures. For example, a difference between a minimum width and a maximum width of a single one of the plurality of trench structures located, along the second lateral direction, in a center of the active transistor area may be larger than in the transition area to the edge termination area. For example, the width of one or more trench structures, located in the transition area along the second lateral direction, may be constant while at least some of the trench structures located in the transistor cell area may vary along the first lateral direction.

For example, the width in the end part may decrease continuously along the first lateral direction.

For example, the width in the end part may be in a range from 10% to 100% of the width in the more central part with respect to at least 80% of the extent of the end part along the first lateral direction. For example, the width in the end part, e.g. located in the transition area along the second lateral direction, may be in a range from 10% to 100%, or from 20% to 90%, or from 30% to 80%, of the width in the more central part, e.g. in the transistor cell area, with respect to at least 80% of the extent of the end part along the first lateral direction.

For example, a top view on an end face of the at least some of the plurality of trench structures may be linear, curved, or a sequence of linear end face segments. The top view on the end face of the at least some of the plurality of trench structures may also be a combination of the above exemplary shapes, or may include other shapes.

For example, a vertical trench depth may be smaller for the at least one of the trench structures arranged outermost along the second lateral direction than in a central part of the plurality of trench structures.

For example, a vertical trench depth may be smaller in the end part, e.g. in the transition area between the active transistor area and the edge termination area, than in the more central part, e.g. in the active transistor area, of the at least some of the plurality of trench structures.

For example, the VJFET may further include a trench sidewall implant doping profile. A conductivity type of the trench sidewall implant doping profile may be equal to the conductivity type of a channel region that is part of the plurality of mesa regions. A vertical depth of the trench sidewall implant doping profile may be smaller for the at least one of the trench structures arranged outermost along the second lateral direction than in a central part of the plurality of trench structures. In addition or as an alternative, the vertical depth of the trench sidewall implant doping profile may be smaller in the end part than in the more central part of the at least some of the plurality of trench structures.

For example, the semiconductor body may include a SiC semiconductor substrate, and the end part may directly adjoin an edge termination area including an edge termination structure.

For example, the VJFET may further include a gate runner line, and a gate runner line portion may extend along the first lateral direction directly over the at least one of the trench structures. The gate runner line portion may be electrically connected to the gate contact material in the at least one of the plurality of trench structures. The gate runner line may be a line that at least partly surrounds a cell array of VJFET transistor cells and serves as an interconnection line for branch-lines that are electrically connected to the gate region of the individual transistor cells. For example, the branch-lines and the gate runner line may, at least in part, be in the shape of a comb.

Details with respect to structure, or function, or technical benefit of features described above with respect to a VJFET likewise apply to the exemplary methods described herein. Processing the semiconductor body may comprise one or more optional additional features corresponding to one or more aspects mentioned in connection with the proposed concept or one or more examples described above or below.

An example of the present disclosure relates to a method for manufacturing a vertical junction field effect transistor (VJFET). The method may include forming a plurality of mesa regions extending along a first lateral direction in a semiconductor body. The method may further include forming a plurality of trench structures extending along the first lateral direction, wherein the plurality of mesa regions and the plurality of trench structures are arranged alternately along a second lateral direction, and the plurality of trench structures may comprise a gate contact material electrically connected to a gate region of a first conductivity type in the semiconductor body via at least one of a bottom side or a sidewall of the plurality of trench structures. A width of the plurality of trench structures may satisfy one or more of the following conditions: i) the width of at least one of the plurality of trench structures arranged outermost along the second lateral direction is smaller than in a more central part of the plurality of trench structures; or ii) the width of at least some of the plurality of trench structures is smaller along an end part in the first lateral direction than in the more central part of the plurality of trench structures. An extent of the end part along the first lateral direction may be larger than a pitch between neighboring trench structures of the plurality of trench structures along the second lateral direction.

For example, forming the trench structure may include forming a plurality of trenches extending into the semiconductor body from a first surface, e.g. by an etch process using an etch mask such as a hard mask.

For example, forming the VJFET may further comprise forming a mesa channel region of a second conductivity type.

For example, forming the mesa channel region may include at least one tilted ion implantation process of dopants of the second conductivity type, and an ion implantation tilt angle may range between 5° and 35°. By adjusting the tilt angle, the mesa channel charge amount may be concentrated close to a center of the mesa channel.

For example, forming the mesa channel region may include at least one ion implantation process of dopants of the second conductivity type, and an ion implantation energy may range between 300 KeV and 2 MeV. By adjusting the ion implantation energy for the dopants of the first conductivity type, the mesa channel charge amount may be concentrated close to a center of the mesa channel.

For example, forming the mesa channel region may include at least one ion implantation process of dopants of the second conductivity type configured for a penetration depth of the dopants of the second conductivity type along the first lateral direction that is larger than half of an extent of the mesa region along the second lateral direction.

By adjusting the ion implantation and/or ion implantation energy, the mesa channel charge amount in a central third part of the mesa region may be set larger than in each of the two adjacent outer third parts.

For example, forming the gate region may include at least one ion implantation process of dopants of the first conductivity type through a sidewall and/or a bottom side of the trenches, and an ion implantation energy may range between 10 KeV and 500 keV.

The examples and features described above and below may be combined.

Functional and structural details described with respect to the examples above shall likewise apply to the exemplary examples illustrated in the figures and described further below.

In the following, further examples of vertical junction field effect transistors (VJFETs) are explained in connection with the accompanying drawings. Functional and structural details described with respect to the examples above shall likewise apply to the exemplary embodiments illustrated in the figures and described further below. In the illustrated examples, the first conductivity is p-type and the second conductivity type is n-type for an n-channel VJFET. However, the first conductivity type may also be n-type and the second conductivity type may be p-type for a p-channel VJFET.

FIG. 1A schematically and exemplarily shows a plan view of a VJFET 100. The VJFET includes a plurality of mesa regions 102 extending along a first lateral direction x1, e.g. a longitudinal direction, in a semiconductor body 104. A plurality of trench structures 106 comprising a gate contact material 1063 extend along the first lateral direction x1. The plurality of mesa regions 102 and the plurality of trench structures 106 are arranged alternately along a second lateral direction x2, e.g. a transverse direction. A width w1 of at least one of the plurality of trench structures 106 arranged outermost along the second lateral direction x2, e.g. in a transition region 1081 that is arranged between an active VJFET area 1082 and an edge termination area 1083, is smaller than a width w0 in a more central part 1062 of the plurality of trench structures 106, e.g. in the active VJFET area 1082. In the exemplary design of trench structure width variation illustrated in FIG. 1A, the width decreases toward the edge termination area 1083 from w0 to w1 in steps. Another exemplary design of trench structure width variation is illustrated in the plan view of FIG. 1B.

Figure 1B:
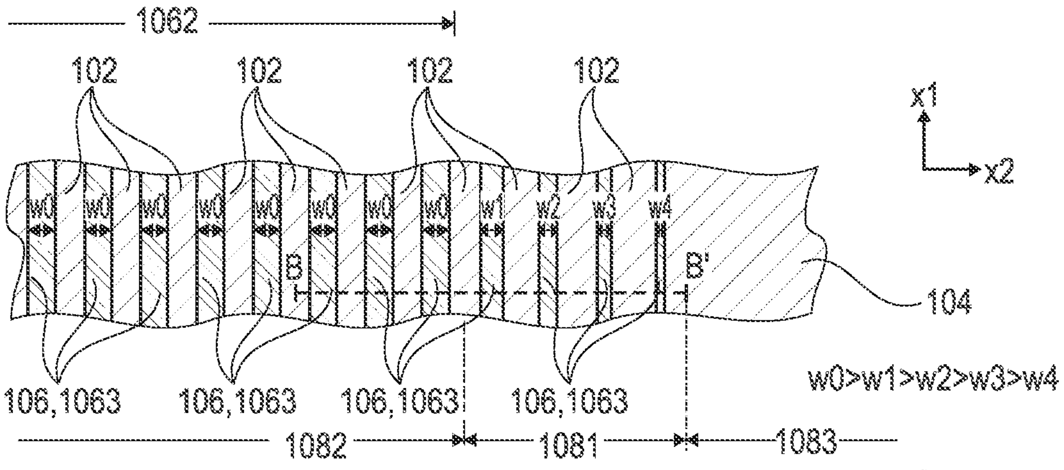

In the exemplary design of trench structure width variation illustrated in FIG. 1B, the width of the trench structures 106 continuously decreases across n trench structures of the plurality of trench structures 106 that are arranged outermost along the second lateral direction x2, e.g. in the transition area 1081, n being an integer ranging from 2 to 100. In FIG. 1B, the width of the trench structures continuously decreases from w0 in the active JFET area 1083 to w4 at the outermost trench structure, i.e. w0>w1>w2>w3>w4.

The above exemplary width variations may be combined and repeated in any way, for example.

The exemplary views of FIGS. 1A and 1B relate to width variations between adjacent trench structures 106 along the second lateral direction x2. FIG. 10 schematically and exemplarily shows a plan view of a VJFET 100 for illustrating an exemplary width variation along the second lateral direction x2.

Referring to FIG. 10, the width of at least some of the plurality of trench structures 106 is smaller along an end part 1061 in the first lateral direction x1, e.g. in the transition region 1081, than in the more central part 1062, of the plurality of trench structures 106, e.g. in the active VJFET area. An extent I of the end part 1061 along the first lateral direction x1 is larger than a pitch p between neighboring trench structures of the plurality of trench structures 106 along the second lateral direction x2.

Figure 1C:
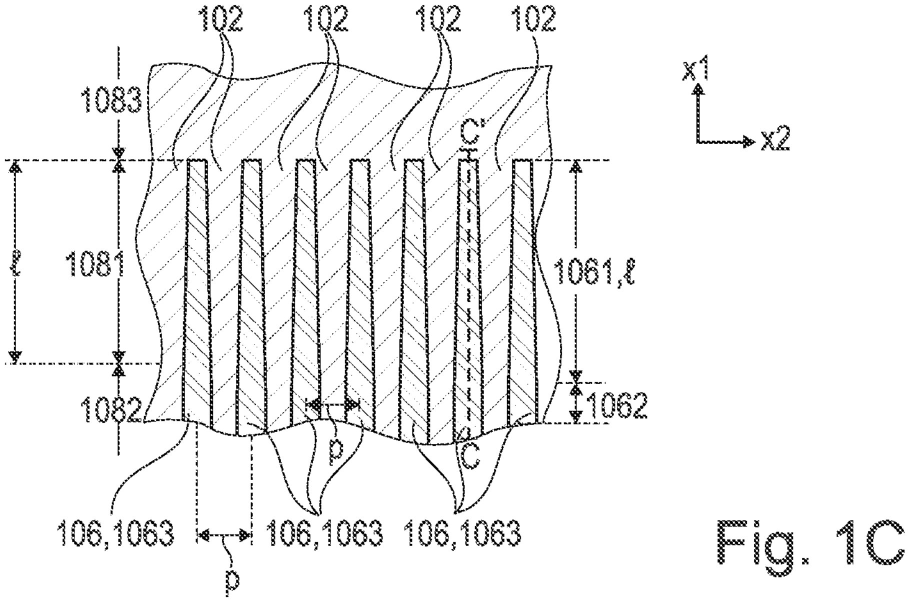
Figure 2A:
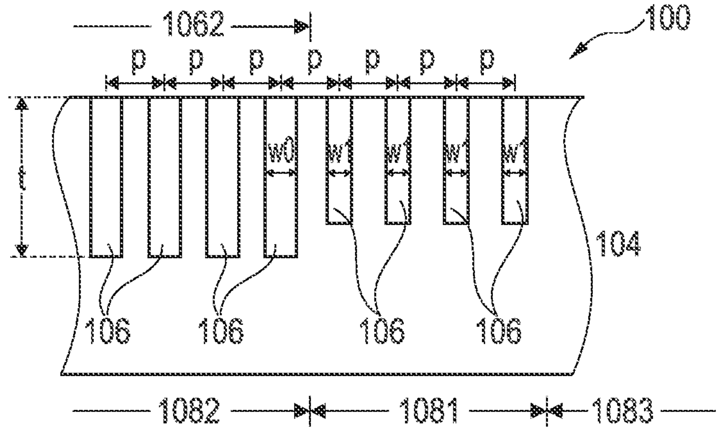
FIGS. 2A to 2C are schematic and exemplary cross-sectional views along intersection lines AA', BB', CC', respectively, of the VJFETs illustrated in FIGS. 1A to 1C.
Figure 2B:
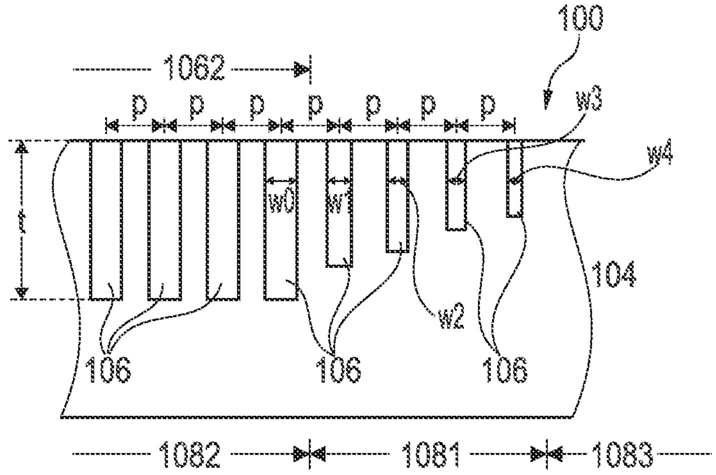
Figure 2C:
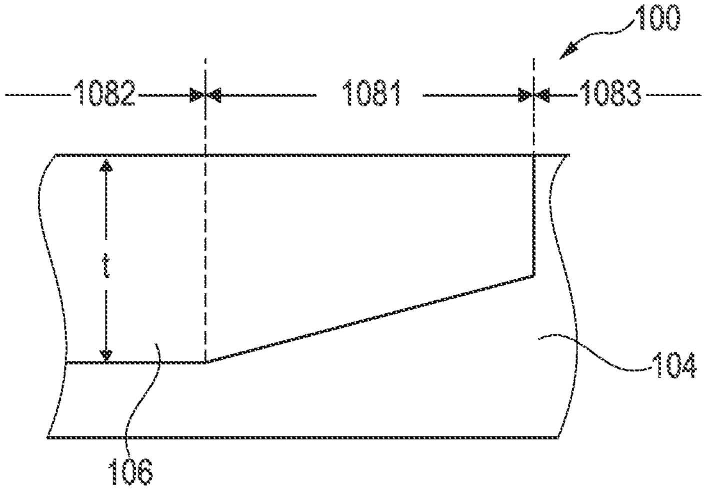

The schematic cross-sectional views of FIGS. 2A, 2B and 2C are exemplary illustrations of variations of trench depths t along intersection lines AA', BB' and CC', respectively, of FIGS. 1A, 1B, 1C.

The schematic cross-sectional view of FIG. 2A refers to intersection line AA' of the VJFET 100 of FIGS. 1A and 1*s* one example of trench depth variation associated with the exemplary VJFET 100 of FIG. 1A. In the illustrated example, a trench depth t decreases from the active VJFET area 1082 toward the edge termination area 1083 in steps.

The schematic cross-sectional view of FIG. 2B refers to intersection line BB' of the VJFET 100 of FIGS. 1B and 1*s* one example of trench depth variation associated with the exemplary VJFET 100 of FIG. 1B. In the illustrated example, the trench depth t continuously decreases from the active VJFET area 1082 toward the edge termination area 1083.

The schematic cross-sectional view of FIG. 2C refers to intersection line CC' of the VJFET 100 of FIG. 10 and is one example of trench depth variation associated with the exemplary VJFET 100 of FIG. 10. In the illustrated example, the trench depth t continuously decreases from the active VJFET area 1082 toward the edge termination area 1083.

Figure 3A:
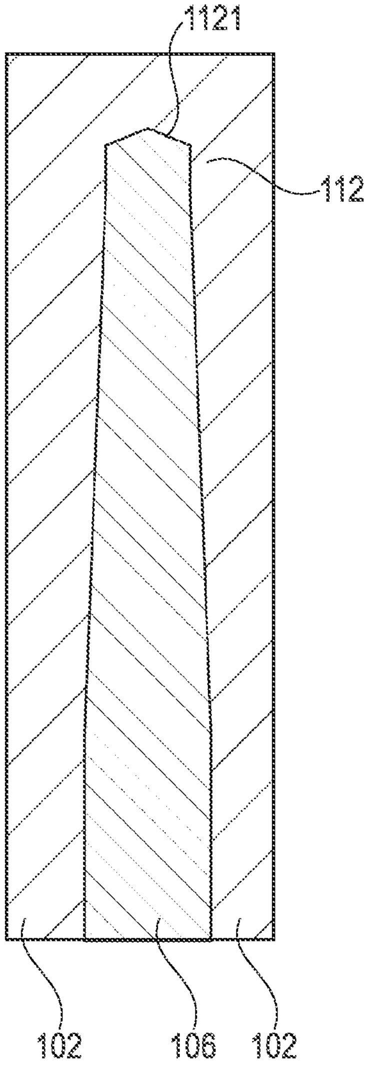
FIGS. 3A and 3B are schematic plan views for illustrating end faces of trench structures of VJFETs.
Figure 3B:
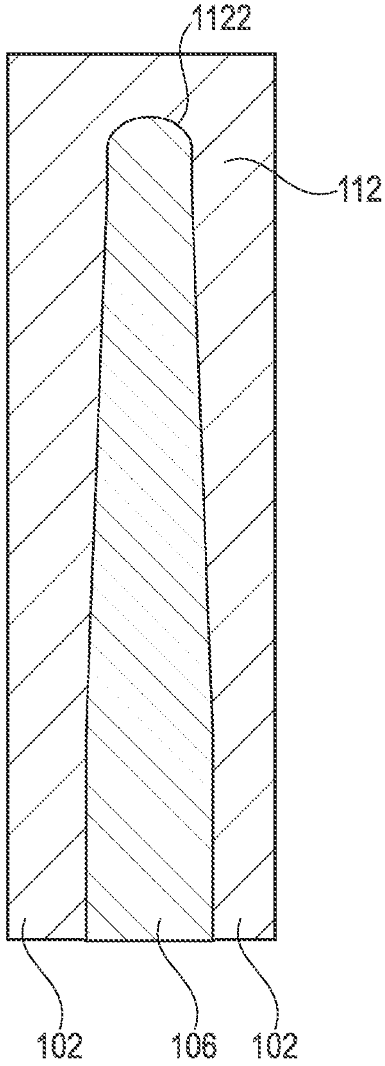

The schematic plan views of FIGS. 3A and 3B illustrate exemplary end faces 112 of the at least some of the plurality of trench structures 106. The top view of FIG. 3A illustrates a sequence of linear end face segments 1121 and the top view of FIG. 3B includes a curved end face segment 1122.

Linear and curved end face segment(s) may be combined in any way for achieving a desired curvature of electric equipotential lines at the ends of the trench structures 106.

Figure 4:
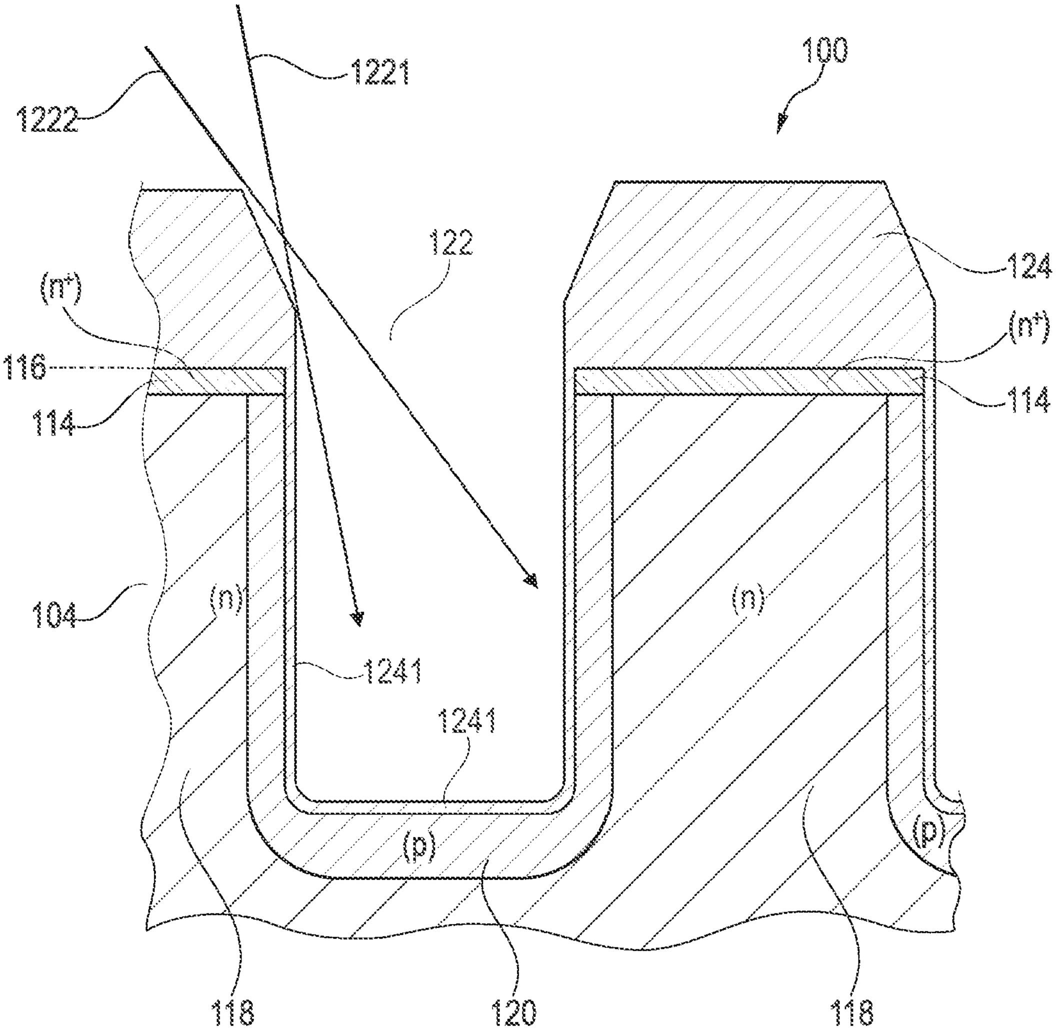
FIG. 4 is a schematic cross-sectional view for illustrating process features of manufacturing a VJFET.

The schematic cross-sectional view of FIG. 4 illustrates exemplary process features during manufacture of the VJFET 100.

The VJFET 100 includes an $n^+$-doped source region 114 at a first surface 116 of the semiconductor body 104. The VJFET 100 further includes an n-doped mesa channel region 118 and a p-doped gate region 120. The p-doped gate region 120 lines sidewalls and a bottom side of trenches 122. In other examples, the p-doped gate region may also line only a portion of the sidewall and/or the bottom side or may even be omitted at the sidewall or at the bottom side. Both the n-doped mesa channel region 118 and the p-doped gate region 120 may be formed by one or more tilted ion implantations schematically illustrated by arrows 1221, 1222 for representing different ion implantation tilt angles of ion beams entering the semiconductor body 104 through openings in an ion implantation mask 124. The ion implantation mask 124 may include a part 1241 that lines the bottom side and sidewalls of the trenches 122.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical junction field effect transistor (VJFET), comprising:

a plurality of mesa regions extending along a first lateral direction in a semiconductor body;

a plurality of gate trench structures extending along the first lateral direction, wherein the plurality of mesa regions and the plurality of gate trench structures are arranged alternately along a second lateral direction, wherein the plurality of gate trench structures comprises a gate contact material electrically connected to a gate region of a first conductivity type outside the plurality of gate trench structures in the semiconductor body via at least one of a bottom side or a sidewall of the plurality of gate trench structures, and wherein a width of the plurality of gate trench structures satisfies one or more of the following conditions:

i) the width of at least one gate trench structure of the plurality of gate trench structures arranged outermost along the second lateral direction is smaller than in a more central part of the plurality of gate trench structures;

ii) the width of at least some gate trench structures of the plurality of gate trench structures is smaller along an end part in the first lateral direction than in the more central part of the plurality of gate trench structures, an extent of the end part along the first lateral direction being larger than a pitch between neighboring gate trench structures of the plurality of gate trench structures along the second lateral direction.

2. The VJFET of claim 1, wherein the width decreases across n gate trench structures of the plurality of gate trench structures that are arranged outermost along the second lateral direction, and wherein n is an integer ranging from 2 to 100.

3. The VJFET of claim 2, wherein a pitch between neighboring gate trench structures of the plurality of gate trench structure is constant along the second lateral direction.

4. The VJFET of claim 1, wherein the width of the at least one gate trench structure of the plurality of gate trench structures is constant, and wherein the number of the at least one gate trench structure of the plurality of gate trench structures is an integer ranging from 2 to 100.

5. The VJFET of claim 4, wherein a pitch between neighboring gate trench structures of the plurality of gate trench structure is constant along the second lateral direction.

6. The VJFET of claim 1, wherein the width of the at least one gate trench structure of the plurality of gate trench structures is in a range from 10% to 95% of the width in the more central part of the plurality of gate trench structures.

7. The VJFET of claim 1, wherein the width of the at least some gate trench structures of the plurality of gate trench structures is in a range from 10% to 95% of the width in the more central part of the plurality of gate trench structures.

8. The VJFET of claim 1, wherein the width of at least 90% of the gate trench structures of the plurality of gate trench structures is smaller along the end part in the first lateral direction than in the more central part of the at least 90% of the gate trench structures of the plurality of gate trench structures.

9. The VJFET of claim 1, wherein the width in the end part decreases continuously along the first lateral direction.

10. The VJFET of claim 1, wherein the width in the end part is in a range from 10% to 100% of the width in the more central part with respect to at least 80% of the extent of the end part along the first lateral direction.

11. The VJFET of claim 1, wherein a top view on an end face of the at least some gate trench structures of the plurality of gate trench structures is linear, curved, or a sequence of linear end face segments.

12. The VJFET of claim 1, wherein a vertical trench depth is smaller for the at least one gate trench structure of the plurality of gate trench structures arranged outermost along the second lateral direction than in a central part of the plurality of gate trench structures.

13. The VJFET of claim 1, wherein a vertical trench depth is smaller in the end part than in the more central part of the at least some gate trench structures of the plurality of gate trench structures.

14. The VJFET of claim 13, further comprising:

a trench sidewall implant doping profile, wherein a conductivity type of the trench sidewall implant doping profile is equal to the conductivity type of a channel region that is part of the plurality of mesa regions, and wherein a vertical depth of the trench sidewall implant doping profile is smaller for the at least one gate trench structure of the plurality of gate trench structures arranged outermost along the second lateral direction than in a central part of the plurality of gate trench structures.

15. The VJFET of claim 13, further comprising:

a trench sidewall implant doping profile, wherein a conductivity type of the trench sidewall implant doping profile is equal to the conductivity type of a channel region that is part of the plurality of mesa regions, and wherein a vertical depth of the trench sidewall implant doping profile is smaller in the end part than in the more central part of the at least some gate trench structures of the plurality of gate trench structures.

16. The VJFET of claim 1, wherein the semiconductor body includes a SiC semiconductor substrate, and wherein the end part directly adjoins an edge termination area including an edge termination structure.

17. The VJFET of claim 1, further comprising:

a gate runner line portion extending along the first lateral direction directly over the at least one gate trench structure of the plurality of gate trench structures, the gate runner line portion being electrically connected to the gate contact material in the at least one gate trench structure of the plurality of gate trench structures.

18. The VJFET of claim 1, wherein the plurality of gate trench structures further comprises a dielectric structure, and wherein the gate contact material of the plurality of gate trench structures is electrically connected to the gate region through an opening in the dielectric structure.

19. A method for manufacturing a vertical junction field effect transistor (VJFET), the method comprising:

forming a plurality of mesa regions extending along a first lateral direction in a semiconductor body;

forming a plurality of gate trench structures extending along the first lateral direction, wherein the plurality of mesa regions and the plurality of gate trench structures are arranged alternately along a second lateral direction, wherein the plurality of gate trench structures comprises a gate contact material electrically connected to a gate region of a first conductivity type outside the plurality of gate trench structures in the semiconductor body via at least one of a bottom side or a sidewall of the plurality of gate trench structures, and wherein a width of the plurality of gate trench structures satisfies one or more of the following conditions:

i) the width of at least one gate trench structure of the plurality of gate trench structures arranged outermost along the second lateral direction is smaller than in a more central part of the plurality of gate trench structures;

ii) the width of at least some gate trench structures of the plurality of gate trench structures is smaller along an end part in the first lateral direction than in the more central part of the plurality of gate trench structures, an extent of the end part along the first lateral direction being larger than a pitch between neighboring gate trench structures of the plurality of gate trench structures along the second lateral direction.

20. The VJFET of claim 18, wherein the opening in the dielectric structure is at a bottom side of the plurality of gate trench structures.

* * * * *